United States Patent
Pfeuffer

(10) Patent No.: US 9,425,358 B2
(45) Date of Patent: Aug. 23, 2016

(54) OPTOELECTRONIC SEMICONDUCTOR CHIP AND METHOD FOR PRODUCTION THEREOF

(71) Applicant: OSRAM Opto Semiconductors GmbH, Regensburg (DE)

(72) Inventor: Alexander F. Pfeuffer, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/428,937

(22) PCT Filed: Sep. 12, 2013

(86) PCT No.: PCT/EP2013/068889
§ 371 (c)(1),
(2) Date: Mar. 17, 2015

(87) PCT Pub. No.: WO2014/044592
PCT Pub. Date: Mar. 27, 2014

(65) Prior Publication Data
US 2015/0236209 A1 Aug. 20, 2015

(30) Foreign Application Priority Data
Sep. 20, 2012 (DE) .......... 10 2012 108 883

(51) Int. Cl.
*H01L 33/38* (2010.01)
*H01L 33/20* (2010.01)
(Continued)

(52) U.S. Cl.
CPC ....... *H01L 33/382* (2013.01); *H01L 31/02002* (2013.01); *H01L 31/0203* (2013.01);
(Continued)

(58) Field of Classification Search
None
See application file for complete search history.

(56) References Cited

U.S. PATENT DOCUMENTS 6,650,018 B1 * 11/2003 Zhao ............... H01L 33/38
257/749
7,994,519 B2 8/2011 Fehrer et al.
(Continued)

FOREIGN PATENT DOCUMENTS

DE 207288 A1 2/1984
DE 102007022947 A1 10/2008
(Continued)

OTHER PUBLICATIONS

"Optical Properties of Iridium," Web Mineral, http://webmineral.com/data/Iridium.shtml#.VN3UZrFfxBM, Sep. 5, 2012.
(Continued)

*Primary Examiner* — Anthony Ho
*Assistant Examiner* — Kevin Quinto
(74) *Attorney, Agent, or Firm* — Slater Matsil, LLP

(57) ABSTRACT

An optoelectronic semiconductor chip includes a semiconductor body and a carrier, on which the semiconductor body is arranged. The semiconductor body has a semiconductor layer sequence with an active region provided for generating or receiving radiation, a first semiconductor layer and a second semiconductor layer. The active region is arranged between the first semiconductor layer and the second semiconductor layer. The first semiconductor layer is arranged on the side of the active region facing away from the carrier. A trench structure extends through the second semiconductor layer and the active region into the first semiconductor layer. An electrical contact structure with a plurality of contact strips is formed between the carrier and the semiconductor body. The contact strips in the trench structure are connected in an electrically conductive manner to the first semiconductor layer.

17 Claims, 5 Drawing Sheets

(51) Int. Cl.

| | |
|---|---|
| *H01L 33/48* | (2010.01) |
| *H01L 33/62* | (2010.01) |
| *H01L 31/0203* | (2014.01) |
| *H01L 31/0224* | (2006.01) |
| *H01L 31/02* | (2006.01) |
| *H01L 31/0352* | (2006.01) |
| *H01L 31/18* | (2006.01) |

(52) U.S. Cl.
CPC ....... *H01L31/0224* (2013.01); *H01L 31/0352* (2013.01); *H01L 31/18* (2013.01); *H01L 33/20* (2013.01); *H01L 33/486* (2013.01); *H01L 33/62* (2013.01); *H01L 2933/0016* (2013.01); *H01L 2933/0033* (2013.01); *H01L 2933/0066* (2013.01)

(56) References Cited

U.S. PATENT DOCUMENTS

| | | | |
|---|---|---|---|
| 8,653,540 | B2 | 2/2014 | Engl et al. |
| 8,823,024 | B2 | 9/2014 | Engl et al. |
| 2004/0140473 | A1 | 7/2004 | Chen |
| 2004/0195579 | A1* | 10/2004 | Sonobe .................. H01L 24/17 257/99 |
| 2005/0029533 | A1* | 2/2005 | Wu ..................... H01L 33/0095 257/99 |
| 2005/0056855 | A1 | 3/2005 | Lin et al. |
| 2006/0192223 | A1 | 8/2006 | Lee et al. |
| 2007/0096130 | A1 | 5/2007 | Schiaffino et al. |
| 2008/0230791 | A1 | 9/2008 | Lin et al. |
| 2009/0283787 | A1 | 11/2009 | Donofrio et al. |
| 2010/0127397 | A1 | 5/2010 | Chen et al. |
| 2011/0108971 | A1* | 5/2011 | Ewe ........................ H01L 21/56 257/686 |
| 2013/0187192 | A1 | 7/2013 | Hoeppel |

FOREIGN PATENT DOCUMENTS

| | | |
|---|---|---|
| DE | 102007046743 A1 | 4/2009 |
| DE | 102008011848 A1 | 9/2009 |
| DE | 102010025320 A1 | 12/2011 |
| EP | 1667241 A1 | 6/2006 |
| EP | 2015372 A2 | 1/2009 |

OTHER PUBLICATIONS

"Optical Properties of Platinum," Web Mineral, http://webmineral.com/data/Platinum.shtml#.VN3Te7FfxBM, Sep. 5, 2012.
"Optical Properties of Rhodium," Web Mineral, http://webmineral.com/data/Rhodium.shtml#.VN3UHrFfxBM, Sep. 5, 2012.
"Optical Properties of Silver," Web Mineral, http://webmineral.com/data/Silver.shtml#.VN3UILFfxBM, Sep. 5, 2012.

* cited by examiner

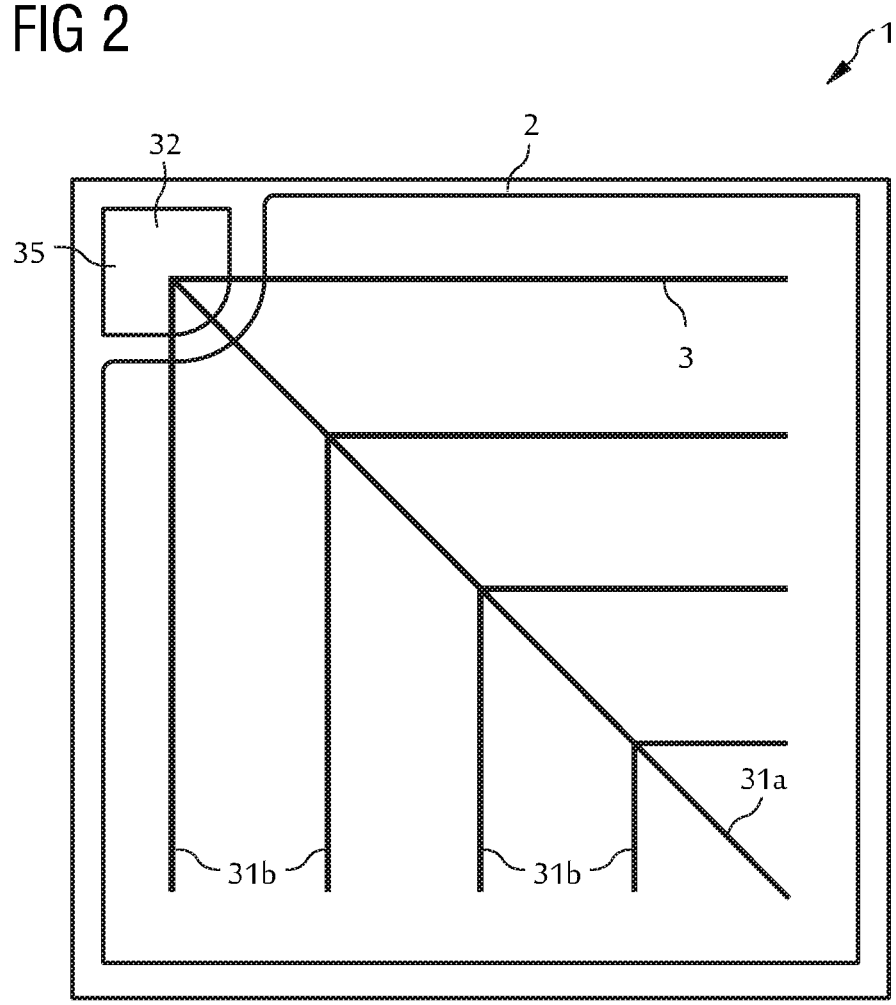

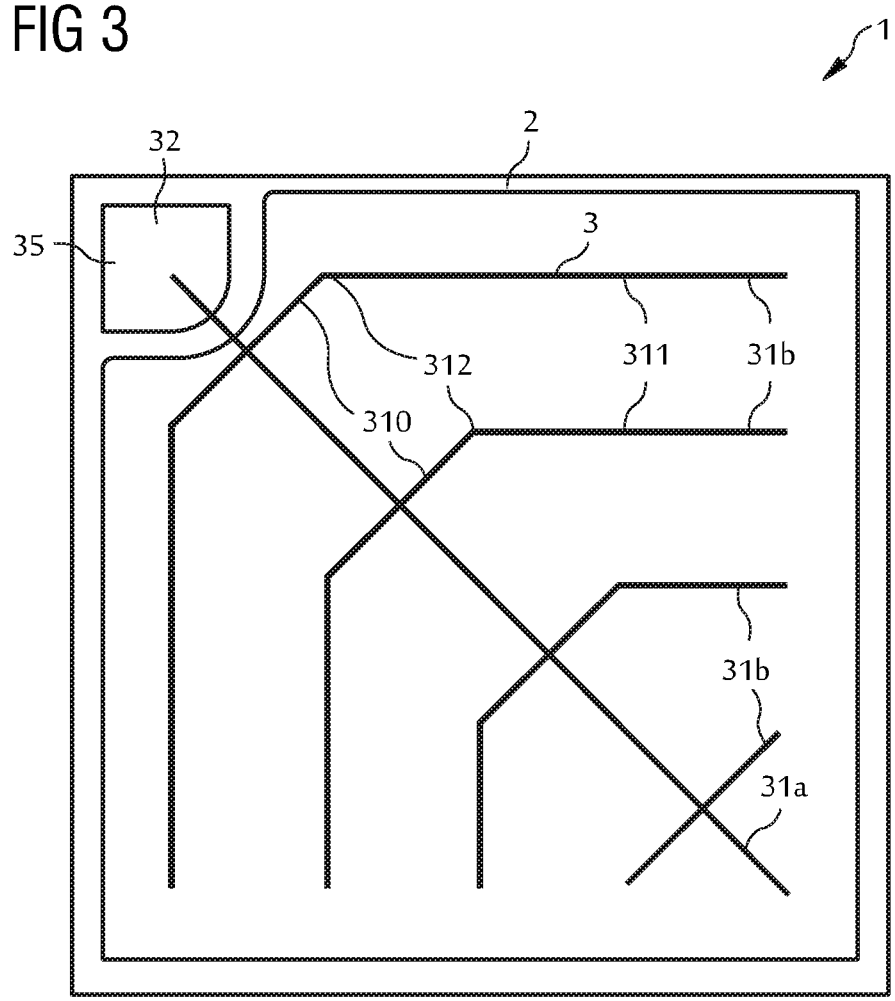

OPTOELECTRONIC SEMICONDUCTOR CHIP AND METHOD FOR PRODUCTION THEREOF

This patent application is a national phase filing under section 371 of PCT/EP2013/068889, filed Sep. 12, 2013, which claims the priority of German patent application 10 2012 108 883.7, filed Sep. 20, 2012, each of which is incorporated herein by reference in its entirety.

TECHNICAL FIELD

The present application relates to an optoelectronic semiconductor chip and also a method for producing optoelectronic semiconductor chips.

BACKGROUND

In the case of radiation-emitting semiconductor chips, contact finger structures can be provided for uniform current introduction. Such metallic contact structures, which are arranged on the radiation exit surface, obstruct the radiation coupling out from the component, however.

SUMMARY

Embodiments of the invention specify a semiconductor chip which is distinguished by homogeneous current introduction and simultaneously good radiation coupling-out properties. Furthermore, a method is to be specified, using which such a semiconductor chip can be reliably produced.

According to one embodiment, an optoelectronic semiconductor chip has a semiconductor body and a carrier, on which the semiconductor body is arranged. The semiconductor body has a semiconductor layer sequence having an active region provided for generating or receiving radiation, a first semiconductor layer, and a second semiconductor layer. The active region is arranged between the first semiconductor layer and the second semiconductor layer. The first semiconductor layer is arranged on the side of the active region facing away from the carrier. A trench structure is implemented in the semiconductor body, which extends through the second semiconductor layer and the active region into the first semiconductor layer. An electrical contact structure having a plurality of contact webs is implemented between the carrier and the semiconductor body. The contact webs are electrically conductively connected in the trench structure to the first semiconductor layer.

The semiconductor body preferably extends, in a vertical direction extending perpendicularly to a main extension plane of the semiconductor layers of the semiconductor layer sequence, between a first main surface facing away from the carrier and a second main surface facing toward the carrier. The first semiconductor layer and the second semiconductor layer are expediently different from one another with respect to their conduction type. For example, the first semiconductor layer can be embodied as n-conductive and the second semiconductor layer can be embodied as p-conductive or vice versa. The first semiconductor layer, the second semiconductor layer, and/or the active region can be implemented as multilayered.

The first semiconductor layer can be contacted on the rear side by means of the trench structure implemented in the second main surface of the semiconductor body. The trench structure ends in the vertical direction in the first semiconductor layer. In a top view of the semiconductor chip, the semiconductor body, in particular the first semiconductor layer, covers the trench structure and the contact webs. The first main surface of the semiconductor body used as the radiation passage surface can be implemented as free of an external contact. The risk of shading by a contact structure can thus be avoided.

A trench structure is generally understood as a structure which is implemented at least regionally as trench-shaped. Trench-shaped means that the structure at least regionally has a greater extension along a longitudinal direction than in a transverse direction extending perpendicularly to the longitudinal direction. The extension in the longitudinal direction of at least one of the trenches of the trench structure is, at least at points, preferably at least twice as large, particularly preferably at least ten times as large as the associated extension in the transverse direction.

In a preferred embodiment, a terminal layer adjoins the second main surface. The second semiconductor layer can be electrically contacted by means of the terminal layer. The contact structure and the terminal layer are preferably arranged without overlap in relation to one another in a top view of the semiconductor chip. This means that the terminal layer and the contact structure are both not present at any point of the semiconductor chip. In other words, the second main surface is subdivided into regions for contacting the first semiconductor layer and regions for contacting the second semiconductor layer.

The contact structure is expediently implemented as coherent. External contacting via the contact structure is thus simplified. Furthermore, the terminal layer is preferably also implemented as coherent. Alternatively, the terminal layer can be divided, in particular by means of the trench structure, into regions spaced apart from one another, which are electrically conductively connected to one another via a further layer.

The contact webs preferably contain a material which has a high reflectivity for the radiation which is generated or to be detected in the active region in operation. In the ultraviolet and visible spectral ranges, for example, silver, rhodium, and iridium are distinguished by a high reflectivity. Alternatively or additionally, however, another material can also be used, for example, aluminum, palladium, nickel, or chromium, or a metallic alloy having at least one of the mentioned metals. In the infrared spectral range, for example, gold is distinguished by a high reflectivity.

In a further preferred embodiment, the contact structure has a contact region, which is electrically conductively connected to the contact webs. The contact region is arranged adjacent to the semiconductor body in the lateral direction. In other words, the contact region is not covered by the semiconductor body. A transverse extension of the contact webs preferably decreases at least regionally with increasing distance from the contact surface. A cross-sectional area of the contact webs is preferably adapted to the current density occurring at the respective point. The current density is typically highest close to the contact region and decreases with increasing distance from the contact region. A contact surface for the external electrical contacting of the semiconductor chip, for example, by means of a wire bond connection, can be implemented on the contact region.

Various geometries can be expedient for the embodiment of the contact structure. If the contact region is positioned in a corner region of the semiconductor chip, the contact webs can be arranged radially, for example, wherein contact webs adjacent to one another each enclose an acute angle with one another, for example, an angle between 10° inclusive and 50° inclusive.

In a further embodiment variant, one of the contact webs is a main web, from which further contact webs branch off. The main web can extend in particular along a diagonal of the semiconductor chip in a top view of the semiconductor chip. Further contact webs preferably branch off in each case on both sides of the main web in a top view of the semiconductor chip.

The further contact webs at least regionally or along their entire length can extend obliquely in relation to the main web. For example, further contact webs can be arranged at an angle between 10° inclusive and 60° inclusive, for example, 45°, in relation to the main web. Furthermore, at least two of the further contact webs or also all further contact webs can extend parallel to one another. The further contact webs can extend linearly, i.e., free of a bend or a kink. Alternatively, the further contact webs can also have subregions, which extend at different angles in relation to the main web. For example, two linear subregions can be connected to one another via a kink or a curved region.

In a preferred embodiment, the second semiconductor layer directly adjoins the contact structure. A region, which has a reduced conductivity in comparison to the remaining second semiconductor layer, is preferably implemented in the second semiconductor layer. By means of this region, an electrical short-circuit between the terminal layer and the contact structure can be avoided. In other words, the region disconnects that part of the second semiconductor layer which is connected to the terminal layer from the region of the semiconductor layer which adjoins the contact structure, in particular in the region of the trench structure.

Alternatively or additionally, an insulation layer can be arranged between the second semiconductor layer and the contact structure, which electrically insulates the contact structure from the second semiconductor layer. In this case, a region of reduced conductivity of the second semiconductor layer can be omitted.

In the lateral direction, i.e., in a direction extending along the main extension plane of the semiconductor layers of the semiconductor layer sequence, the semiconductor body is preferably delimited by a lateral surface. The lateral surface can be implemented perpendicularly or obliquely to the lateral direction.

In a preferred refinement, an edge region of the semiconductor body adjoining the lateral surface is electrically deactivated. This means that the material of the semiconductor body is treated in this region such that it has only a comparatively low electrical conductivity. Preferably, all of the material of the semiconductor body adjoining the lateral surface is electrically deactivated at least to the height of the active region. The risk of an electrical short-circuit can thus be avoided. In this case, a passivation layer covering the lateral surface can be omitted. Alternatively or additionally to the electrical deactivation of the material adjoining the lateral surface, however, such a passivation layer can also be provided.

In a method for producing a plurality of optoelectronic semiconductor chips, according to one embodiment, a semiconductor layer sequence having a first semiconductor layer, an active region, and a second semiconductor layer is provided. The semiconductor layer sequence can be provided, for example, on a growth substrate for the epitaxial deposition of the semiconductor layer sequence or on an auxiliary carrier. A trench structure is implemented, which extends through the second semiconductor layer and the active region into the first semiconductor layer. A contact structure having a plurality of contact webs is implemented, wherein the contact webs are electrically conductively connected in the trench structure to the first semiconductor layer. The semiconductor layer sequence is fastened on a carrier. The carrier having the semiconductor layer sequence fastened on the carrier is singulated into the plurality of semiconductor chips.

The contact structure can thus be implemented before the semiconductor layer sequence is fastened on the carrier. The carrier is different from the growth substrate for the semiconductor layer sequence and can therefore be selected with regard to other criteria, independently of its suitability as an epitaxial growth substrate, for example, with regard to a high electrical and/or thermal conductivity.

In a preferred embodiment, the semiconductor layer sequence is structured before the singulation into a plurality of semiconductor bodies. The structuring into semiconductor bodies is preferably performed after the semiconductor layer sequence is already fastened on the carrier. Notwithstanding this, the structuring can also be performed before the fastening on the carrier, however.

The lateral surfaces of the semiconductor body can be at least regionally electrically deactivated. The deactivation can be performed, for example, by means of ion implantation, a sputtering method, or by means of a plasma treatment, for example, a treatment using a hydrogen plasma. A crystal damage can be achieved by a sputtering method, which causes an electrical deactivation of the semiconductor material.

In a further preferred embodiment, a terminal layer is regionally applied directly to the second semiconductor layer. A region of reduced conductivity can be implemented in the second semiconductor layer for the electrical insulation of the terminal layer from the contact structure. The implementation of this region can be performed by means of ion implantation or by means of a plasma treatment.

In a preferred refinement, the contact structure and the terminal layer are used as masks during the implementation of the region of reduced conductivity. The implementation of the region is thus performed in a self-aligning manner. Regions covered by the contact structure and the terminal layer are thus protected by the contact structure and the terminal layer during the implementation of the region of reduced conductivity.

In a further preferred embodiment, a contact surface for the external electrical contacting is galvanically deposited on the contact structure. In particular, a current-free galvanic method can be used. The galvanic deposition can be performed in a self-aligning manner, so that no additional photolithography level is required for the implementation of the contact surface.

Using the described method, semiconductor chips can be produced in a simple and reliable manner, in which no shading takes place on the radiation passage surface and in which simultaneously charge carriers can be injected homogeneously into the active region in the lateral direction or, in the case of a radiation receiver, can be transported away efficiently out of the active region. In particular, the method is distinguished by a small number of photolithography levels, whereby the production effort and therefore the production costs are reduced. For example, three photolithography levels can already be sufficient.

The described method is particularly suitable for producing a further above-described semiconductor chip. Features set forth in conjunction with the semiconductor chip can therefore also be used for the method and vice versa.

BRIEF DESCRIPTION OF THE DRAWINGS

Further features, embodiments, and expediencies result from the following description of the exemplary embodiments in conjunction with the figures.

In the figures:

FIGS. 2 and 3 each show further exemplary embodiments of a semiconductor chip in a schematic top view.

Identical, equivalent, or identically acting elements are provided with the same reference signs in the figures.

The figures and the size relationships of the elements shown in the figures are not to be considered to be to scale. Rather, individual elements can be shown exaggeratedly large for better illustration ability and/or for better comprehension.

DETAILED DESCRIPTION OF ILLUSTRATIVE EMBODIMENTS

Figure 1A:
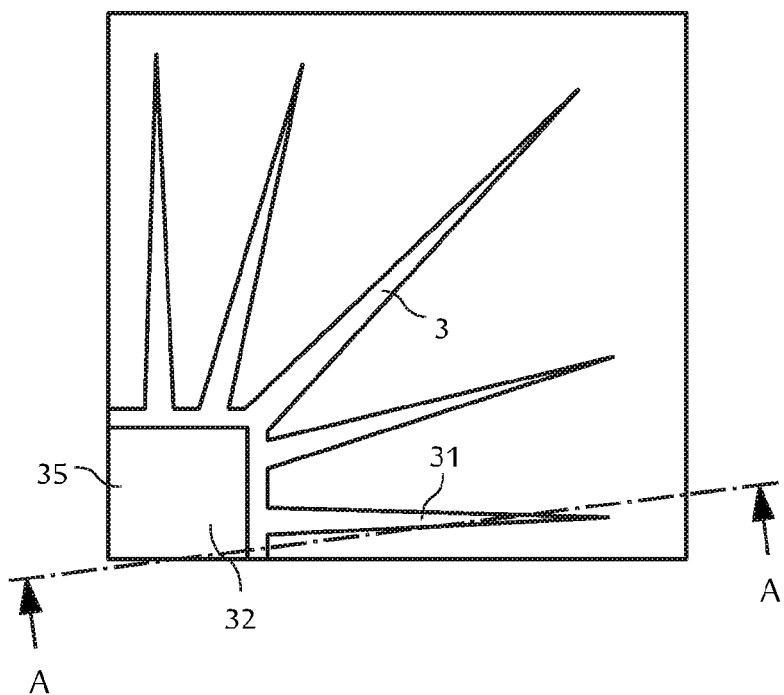
FIGS. 1A and 1B show an exemplary embodiment of a semiconductor chip in a schematic top view in FIG. 1A and associated sectional view along line AA' in FIG. 1B.
Figure 1B:
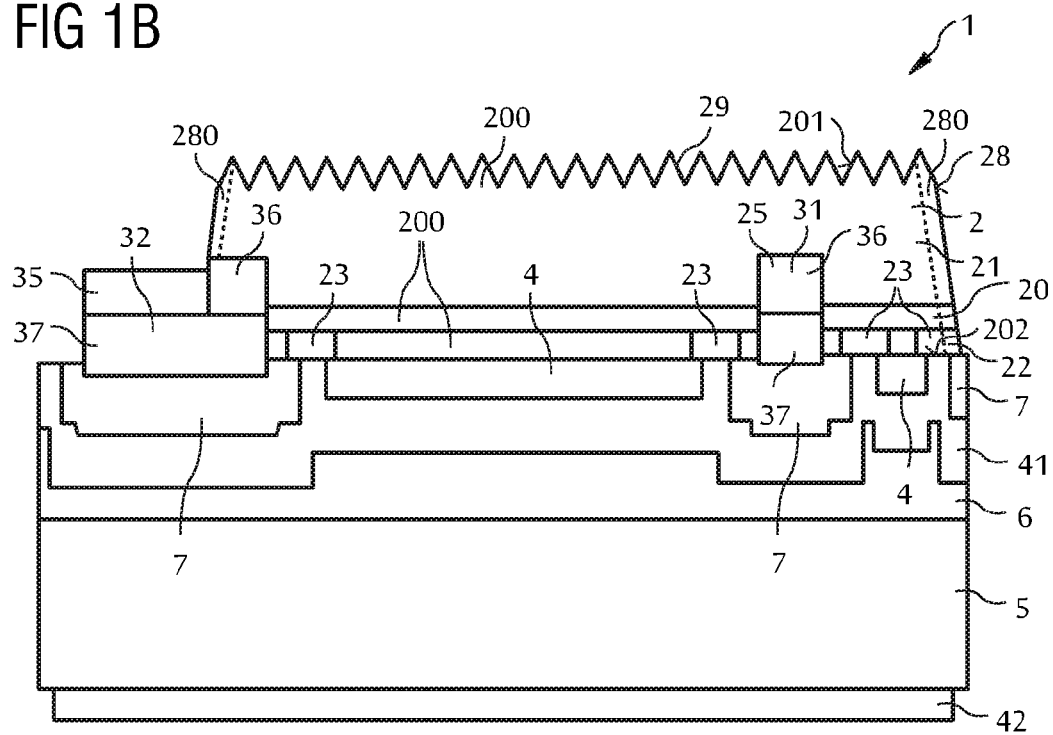

A first exemplary embodiment of a semiconductor chip 1 is shown in a schematic view in FIG. 1A and an associated sectional view along line AA' in FIG. 1B. The semiconductor chip 1 has a semiconductor body 2, which is fastened on a carrier 5, for example, by means of a bonding layer 6, such as an adhesive layer or a solder layer.

The semiconductor body 2 has a semiconductor layer sequence 200, which forms the semiconductor body. The semiconductor body extends in a vertical direction, which extends perpendicularly to a main extension plane of the semiconductor layers of the semiconductor layer sequence, between a first main surface 201 facing away from the carrier 5 and a second main surface 202 facing toward the carrier.

The semiconductor layer sequence 200 has an active region 20 provided for generating radiation. The active region is arranged between a first semiconductor layer 21 of a first conduction type and a second semiconductor layer 22 of a second conduction type, which is different from the first conduction type. For example, the first semiconductor layer 21 can be implemented as n-conductive and the second semiconductor layer as p-conductive or vice versa.

The semiconductor body 2, in particular the active region 20, preferably has a III-V compound semiconductor material.

III-V compound semiconductor materials are particularly suitable for radiation generation in the ultraviolet ($Al_xIn_yGa_{1-x-y}N$) via the visible ($Al_xIn_yGa_{1-x-y}N$, in particular for blue to green radiation, or $Al_xIn_yGa_{1-x-y}P$, in particular for yellow to red radiation) down into the infrared ($Al_xIn_yGa_{1-x-y}As$) spectral ranges. In this case, $0 \leq x \leq 1$, $0 \leq y \leq 1$, and $x+y \leq 1$, in particular with $x \neq 1$, $y \neq 1$, $x \neq 0$, and/or $y \neq 0$. Furthermore, high internal quantum efficiencies can be achieved during the radiation generation using III-V compound semiconductor materials, in particular from the mentioned material systems.

A trench structure 25 is implemented into the semiconductor body 2 from the second main surface 202. In the vertical direction, the trench structure extends completely through the second semiconductor layer 22 and the active region 20 into the first semiconductor layer 21. The trench structure 25 ends in the first semiconductor layer 21, so that the first semiconductor layer completely covers the trench structure in a top view of the semiconductor chip 1. The trench structure preferably ends in a current spreading layer and/or a contact layer within the epitaxial structure of the first semiconductor layer 21.

Furthermore, the semiconductor chip 1 has a contact structure 3. The contact structure comprises a contact region 32 and a plurality of contact webs 31. In the exemplary embodiment shown, the contact region 32 is arranged in a corner of the semiconductor chip. The contact webs 31 extend radially away from the contact region, in a manner originating from the contact region. Contact webs adjacent to one another each enclose an acute angle with one another. The larger the number of the contact webs, advantageously the smaller the angle between adjacent contact webs. The angle can be between 10° inclusive and 50° inclusive, for example.

A contact surface 35 is implemented on the contact region 32 of the contact structure 3. The contact surface 35 is provided for the external electrical contacting, for example, by means of a wire bond connection. The contact surface 35 and the semiconductor body 2 are arranged adjacent to one another in the lateral direction. The contact surface thus does not cover the semiconductor body 2. Instead of the additionally provided layer for forming the contact surface 35, however, the contact region 32 itself can also form such a contact surface.

Notwithstanding the exemplary embodiment shown, the contact region can also be arranged at another point of the semiconductor chip, for example, in the center of the semiconductor chip. In this case, the contact webs can extend in a star shape originating from the contact region, for example.

A cross section of the contact webs 31 decreases with increasing distance from the contact regions 32 in a top view of the semiconductor chip. Close to the contact region 32, the contact webs therefore have a low electrical resistance. In regions of the contact structure 3 more remote from the contact region 32, in contrast, the transverse extension is reduced, to thus minimize the removal of the radiation-generating active region 20 required for the implementation of the trench structure 25.

A terminal layer 4, which regionally directly adjoins the second semiconductor layer 22, is arranged on the second main surface 202. This terminal layer is provided for the injection of charge carriers into the second semiconductor layer. The contact webs 31 and the trench structure 25 are preferably implemented such that the terminal layer 4 is implemented coherently. The terminal layer is preferably implemented as a mirror layer for the radiation generated in the active region or, in the case of a receiver, for the radiation to be received in the active region.

The contact structure 3 and the terminal layer 4 are provided for the injection of charge carriers from different sides of the semiconductor body 2 into the active region 20. To avoid an electrical short-circuit inside the semiconductor chip 1, direct electrical contact does not exist at any point between the terminal layer 4 and the contact structure 3.

In a top view of the semiconductor chip 1, the terminal layer 4 and the contact webs 31 extend without overlap. Therefore, only one of the two layers or neither of the layers is thus arranged at each point of the second main surface 202.

In the exemplary embodiment shown, the contact structure 3 is formed by means of a first contact layer 36 and a second contact layer 37. The first contact layer directly adjoins the first semiconductor layer 21.

The first contact layer 36 and the second contact layer 37 can each themselves be implemented as multilayered. The first contact layer 36 preferably contains a material having a high reflectivity for the radiation generated in the active region 20, preferably having a reflectivity of at least 60%. For example, silver, rhodium, or iridium are distinguished by a high reflectivity in the visible and ultraviolet spectral ranges. Silver is particularly also suitable because of its high electrical conductivity. Gold, for example, is suitable for radiation in the red or infrared spectral range.

The first contact layer 36 can furthermore have an adhesion promoter, for example, titanium.

The second contact layer 37 is preferably used for current spreading and can additionally have a diffusion barrier or multiple diffusion barriers and/or an adhesion promoter layer or multiple adhesion promoter layers. The second contact layer or a partial layer thereof preferably contains one of the materials selected from aluminum, copper, gold, silver, platinum, titanium, or chromium or a metallic alloy having at least one of the mentioned metals.

Aluminum, copper, gold, and silver have a high electrical conductivity and are therefore suitable as a material for good current spreading. For example, platinum is suitable as a diffusion barrier. For example, titanium, chromium, or aluminum can be used as an adhesion promoter. These materials are distinguished in particular by good adhesion on dielectric material.

For a sufficiently low series resistance, the contact webs preferably have a thickness in the vertical direction of at least 2 μm, particularly preferably a thickness of at least 5 μm. The thickness of the contact webs is preferably constant over the entire length.

The greater the extension of the contact webs in the vertical direction, the less the transverse extension of the contact webs can be in the lateral direction with equal resistance.

A further terminal layer 41 is implemented on the side of the terminal layer 4 facing away from the semiconductor body 2. The further terminal layer overlaps with the terminal layer 4 and with the contact structure 3. The further terminal layer 41 is preferably implemented over the entire surface. Furthermore, the further terminal layer 41 preferably extends around the terminal layer 4 along its entire circumference. In this manner, the terminal layer is encapsulated by means of the further terminal layer. The terminal layer can thus be protected particularly efficiently from external influences such as moisture. Furthermore, the further terminal layer can be provided for the purpose of preventing a migration of material of the terminal layer 4. For example, the second terminal layer 41 can contain rhodium or can consist of rhodium. Rhodium is distinguished by a high corrosion resistance and a high reflectivity.

The second semiconductor layer 22 can be electrically contacted in the exemplary embodiment shown via the terminal layer 4, the further terminal layer 41, and the connecting layer 6 through the carrier 5 by means of a further contact surface 42 arranged on the rear side of the carrier 5 facing away from the semiconductor body 2.

An insulation layer 7 is arranged between the further terminal layer 41 and the contact structure 3. The insulation layer is used to avoid an electrical short-circuit between the terminal layer 4 and the contact structure 3.

In the exemplary embodiment shown, regions 23, which have a reduced electrical conductivity in comparison to the remaining second semiconductor layer, are implemented in the second semiconductor layer 22. These regions of reduced electrical conductivity are used to avoid an electrical short-circuit between the terminal layer 4 and the contact structure 3 via the second semiconductor layer 22.

In a top view of the semiconductor chip 1, the regions of reduced conductivity 23 regionally overlap with the regions of the second main surface which are free of the terminal layer 4.

Notwithstanding the described exemplary embodiment, the electrical insulation of the contact structure 3 from the second semiconductor layer 22 can also be formed by means of an insulation layer, which covers the lateral surfaces of the trench structure 25 at least in the region of the p-conductive semiconductor layer 22. In this case, the regions of reduced conductivity 23 of the p-conductive layer 22 can be omitted.

The semiconductor body 2 is delimited in the lateral direction by lateral surfaces 28. The semiconductor material is deactivated in an edge region 280 adjoining the lateral surfaces 28. Such a deactivation can be achieved, for example, by a plasma treatment or by ion implantation.

No photolithography level is required for the production of the deactivated edge regions 280. The effort during the production can thus be reduced further. By means of the deactivated edge region, a short-circuit on the lateral surfaces can be efficiently avoided. A passivation layer can be omitted. Alternatively or additionally to the deactivated region, however, such a passivation layer can be provided.

To increase the coupling-out efficiency, the first main surface 201 has a structuring 29, for example, a roughening or a regular structuring.

The semiconductor chip 1 shown in FIGS. 1A and 1B is implemented, solely as an example, as a radiation-emitting semiconductor chip, for example, a luminescent diode, such as a light-emitting diode. Notwithstanding this, the active region 20 can also be provided as a radiation receiver, for example, as a radiation detector or as a solar cell. In this case, the contact webs 31 are used for the efficient removal of charge carriers generated in the active region 20.

The second exemplary embodiment of a semiconductor chip shown in FIG. 2 essentially corresponds to the first exemplary embodiment described in conjunction with FIGS. 1A and 1B. The figure schematically shows the profile of the contact structure, which is covered by the semiconductor body 2 in a top view of the semiconductor chip 1. The trench structure, in which the contact webs 31 are arranged, is not shown for simplified illustration.

In contrast to the first exemplary embodiment, the contact structure 3 has a main web 31a. The main web extends along a diagonal of the semiconductor chip. Further contact webs 31b extend in each case on both sides of the main web, originating from the main web. The further contact webs on the same side of the main web each extend parallel to one another. Using the described contact structure, a charge carrier injection, which is uniform in the lateral direction, into the active region can be achieved in a simple and reliable manner.

The third exemplary embodiment shown in FIG. 3 essentially corresponds to the second exemplary embodiment described in conjunction with FIG. 2. In contrast thereto, some of the further contact webs 31b, which branch off from the main web 31a, partially have a subregion 310 and a further subregion 311, wherein the subregion and the further subregion extend at different angles to the main web 31a. The structure of the webs is similar to the vein system of a leaf.

In the exemplary embodiment shown, the subregions 310, which each adjoin the main web, extend perpendicularly to the main web 31a. The further subregions each extend at an angle of 45° to the main web 31a. A kink 312 is implemented as a transition between the subregion 310 and the further subregion 311. Notwithstanding this, a bend can also be used instead of a kink. Of course, the contact webs as a whole can also have a regionally curved shape or a curved shape along the entire length of the contact web.

By means of the embodiment of the contact webs shown in FIG. 3, the total length of the contact webs can be reduced with equally high homogeneity of the charge carrier injection into the active region.

Of course, the contact webs can also have a reduced transverse extension with increasing distance from the contact region in the exemplary embodiments shown in FIGS. 2 and 3. For example, the line width at node points between contact webs can be selected in dependence on the number of the contact webs.

An exemplary embodiment of a method for producing a plurality of semiconductor chips is shown in FIGS. 4A to 4D on the basis of intermediate steps, which are each shown in a schematic sectional view, wherein, as an example, a semiconductor chip is produced using the method, which is embodied as described in conjunction with FIGS. 1A and 1B.

Figure 4A:
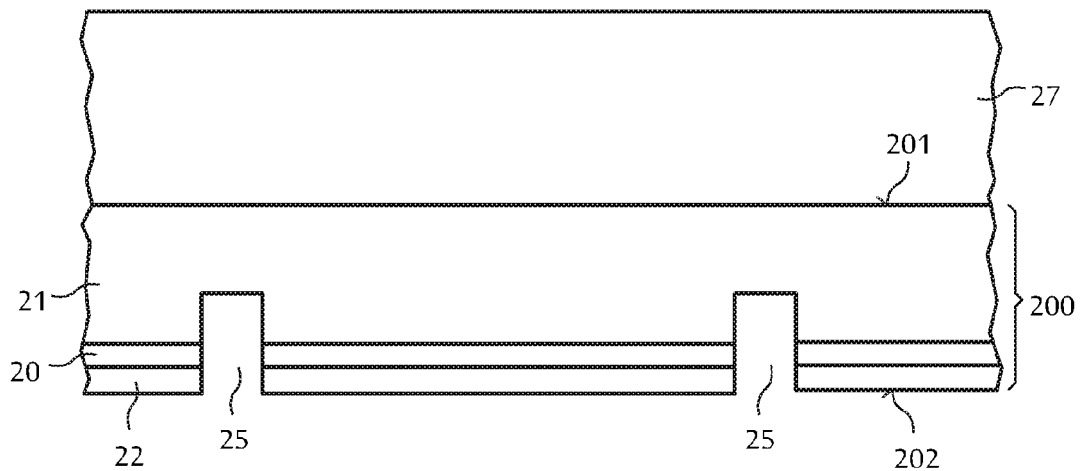
FIGS. 4A to 4D show an exemplary embodiment of a method for producing semiconductor chips on the basis of intermediate steps, which are each schematically shown in a sectional view.

As shown in FIG. 4A, a semiconductor layer sequence 200 having a first semiconductor layer 21, an active region 20, and a second semiconductor layer 22 is provided on a substrate 27. The substrate can be the growth substrate for the semiconductor layer sequence, for example. A trench structure 25, which extends through the second semiconductor layer 22 and the active region 20, is implemented on the second main surface 202 facing away from the substrate. The implementation of the trench structure can be performed, for example, by means of a wet-chemical or dry-chemical etching method.

Figure 4B:
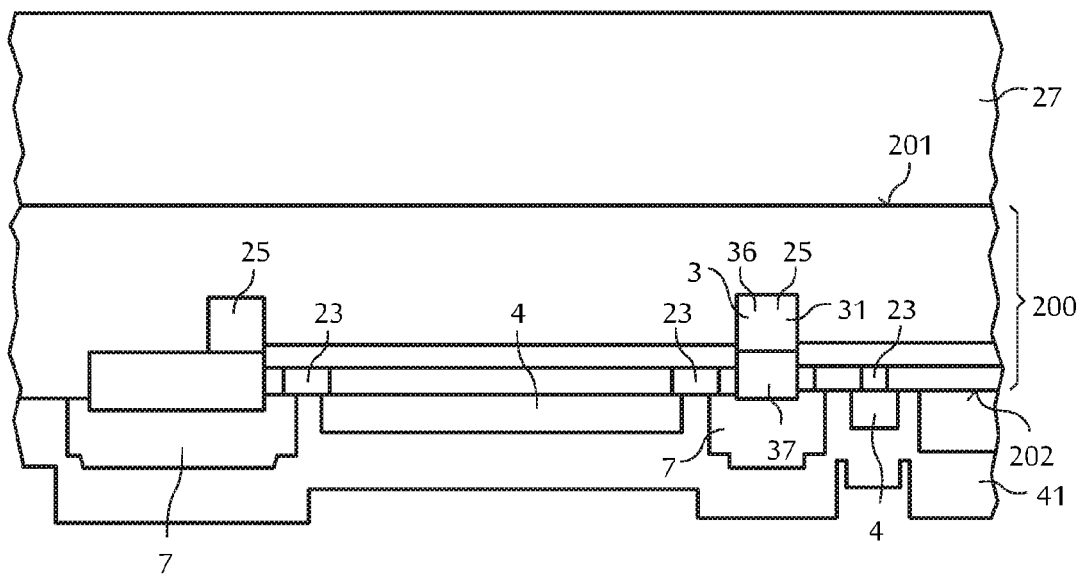

Subsequently, as shown in FIG. 4B, the contact structure 3 and the terminal layer 4 are applied to the second main surface 202. The contact structure 3 and the terminal layer 4 are implemented without overlap on the second main surface 202 and can therefore also be deposited in a shared step. Alternatively, the contact structure 3 and the terminal layer 4 can also be implemented successively. The materials for the contact structure and for the terminal layer can thus be selected independently of one another.

To avoid an electrical short-circuit of the terminal layer 4 with the contact structure 3 via the second semiconductor layer 22, a region 23 having reduced conductivity is implemented in the second semiconductor layer 22. Layers applied to the second main surface 202, in particular the contact structure 3 and the terminal layer 4, can be used as a mask for the implementation of these regions. Such a process is self-aligning and does not require an additional photolithography level or mask. The implementation of the regions can be performed, for example, by means of a plasma method, for example, by means of a hydrogen plasma, by means of ion implantation, or by means of a sputtering method.

An insulation layer 7 is applied to the contact structure 3, which completely covers the contact structure 3. This means that the contact structure 3 does not protrude beyond the insulation layer 7 at any point in a top view of the semiconductor chip 1.

Subsequently, a further terminal layer 41 is applied. The application of the further terminal layer 41 is performed over the entire surface and therefore also does not require an additional lithography level. The further terminal layer 41 regionally adjoins directly on the second semiconductor layer 22 and is used in particular to encapsulate the terminal layer 4. The terminal layer 4 is thus completely encapsulated by means of the second semiconductor layer 22 and the further terminal layer 41. The further terminal layer 41 is electrically insulated from the contact structure 3 by the insulation layer 7.

The layers of the contact structure 3, the terminal layer 4, the further terminal layer 41, and the insulation layer 7 can each be deposited, for example, by means of vapor deposition or sputtering.

Figure 4C:
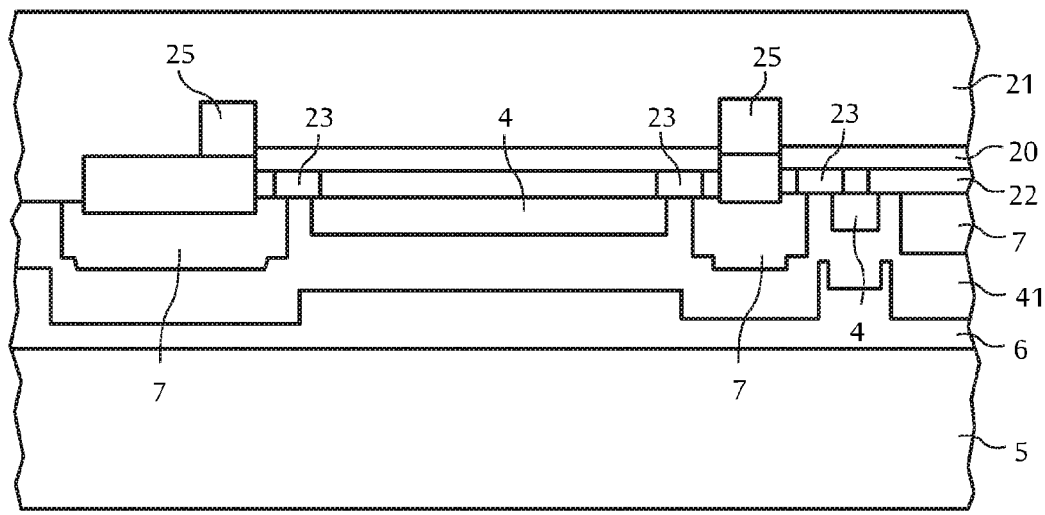
Figure 4D:
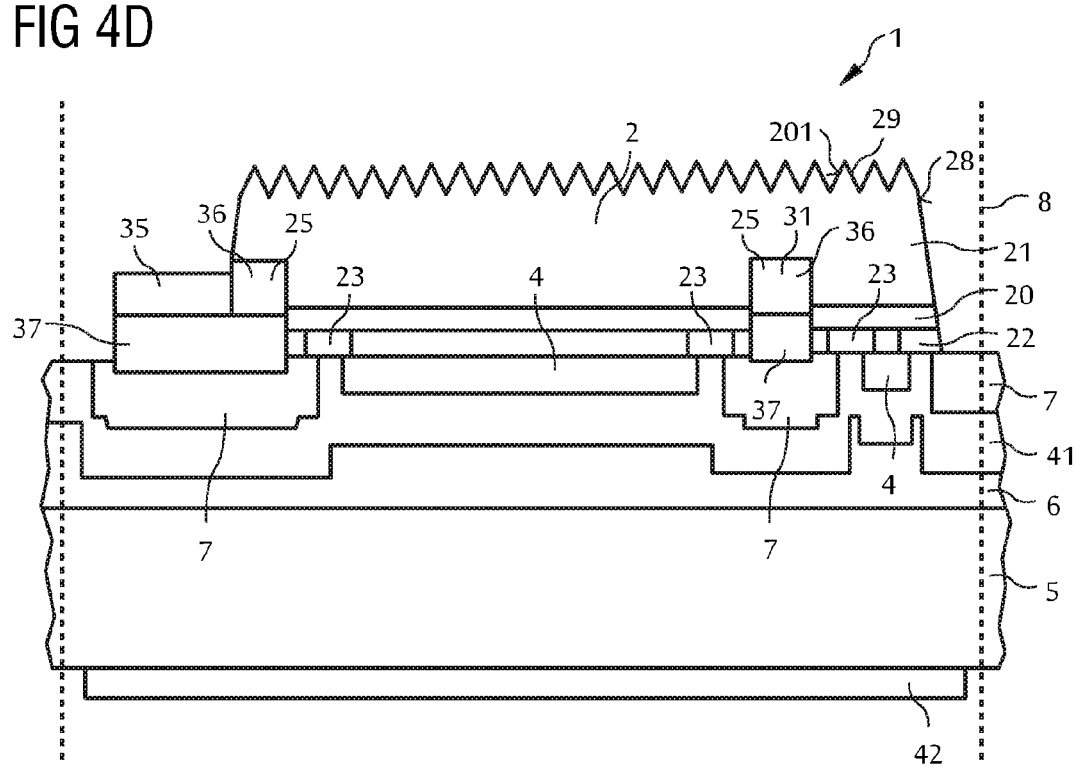

After the implementation of the layers, the semiconductor layer sequence 200 having the layers deposited thereon is fastened on a carrier 5, FIG. 4C. The carrier is used for the mechanical stabilization of the semiconductor layer sequence, so that the substrate 27 is no longer required for this purpose and can be removed. For example, a mechanical method, for example, grinding, lapping, or polishing, and/or a chemical method, for example, wet-chemical or dry-chemical etching, is suitable for the removal of a substrate, in particular a growth substrate. Alternatively, a laser detaching method can also be used. A semiconductor chip in which the growth substrate is removed is also referred to as a thin-film semiconductor chip.

After the removal of the substrate 27, the semiconductor layer sequence 200 is structured into semiconductor bodies 2 which are separate from one another. To increase the coupling-out efficiency, the first main surface 201 is provided with a structuring 29. The structuring can be achieved, for example, by way of a wet-chemical etching method.

For the external electrical contacting of the semiconductor chip, a contact surface 35 is implemented on the contact region 32 of the contact structure 3. The contact surface 35 is implemented in a region of the first contact layer 36, which is exposed by removal of the material of the semiconductor layer sequence. The implementation of the contact surface 35 is preferably performed by means of galvanic deposition, in particular by means of current-free galvanic deposition. In this manner, the contact surface can be implemented in a self-aligning manner and without additional photolithography level. Alternatively, of course, another deposition method is also suitable for the implementation of the contact surface.

For the singulation into semiconductor chips, the carrier 5 having the semiconductor layer sequence 200 is cut along the partition lines 8, for example, mechanically, for example, by means of sawing, splitting, fracturing, or by means of stealth dicing or by means of laser cutting.

Using the described production method, semiconductor chips can be produced in a simple and reliable manner, in which the charge carrier supply takes place exclusively on the rear side viewed from the semiconductor body 2. The first main surface 201 of the semiconductor body, which faces away from the carrier, is completely free of elements for the external electrical contacting, in contrast. Shading can thus be completely prevented. Furthermore, a charge carrier injection which is uniform in the lateral direction can take place by means of the contact webs 31.

The invention is not restricted by the description on the basis of the exemplary embodiments. Rather, the invention comprises every novel feature and every combination of features, which includes in particular every combination of features in the patent claims, even if this feature or this combination is not explicitly specified itself in the patent claims or the exemplary embodiments.

The invention claimed is:
1. An optoelectronic semiconductor chip comprising:
a carrier; and
a semiconductor body arranged on the carrier,
wherein the semiconductor body has a semiconductor layer sequence having an active region provided for generating or receiving radiation, a first semiconductor layer, and a second semiconductor layer, wherein the active region is arranged between the first semiconductor layer and the second semiconductor layer, wherein the first semiconductor layer is arranged on a side of the active region facing away from the carrier, wherein a trench structure is formed in the semiconductor body, the trench structure extending through the second semiconductor layer and the active region into the first semiconductor layer, wherein an electrical contact structure having a plurality of contact webs is disposed between the carrier and the semiconductor body, wherein the contact webs are electrically conductively connected to the first semiconductor layer in the trench structure, wherein a terminal layer adjoins the second semiconductor layer and the contact structure, and wherein the terminal layer and the contact structure are arranged without overlap in relation to one another in a top view of the semiconductor chip.

2. The semiconductor chip according to claim 1, wherein the contact structure has a contact region, and wherein transverse extensions of the contact webs decrease with increasing distance from the contact region.

3. The semiconductor chip according to claim 1, wherein the second semiconductor layer directly adjoins the contact structure and wherein the second semiconductor layer includes a region that has a reduced conductivity in comparison to remaining portions of the second semiconductor layer.

4. The semiconductor chip according to claim 1, wherein the semiconductor body is delimited in a lateral direction by a lateral surface and is electrically deactivated at an edge region of the semiconductor body adjoining the lateral surface.

5. The semiconductor chip according to claim 1, wherein the electrical contact structure further comprises a contact region arranged adjacent to the semiconductor body in a lateral direction, and wherein at least one of the contact webs extends away from the contact region in a manner originating from the contact region.

6. The semiconductor chip according to claim 1, wherein one of the contact webs is a main web, from which further contact webs branch off.

7. The semiconductor chip according to claim 6, wherein the main web extends along a diagonal of the semiconductor chip in a top view of the semiconductor chip.

8. The semiconductor chip according to claim 6, wherein the further contact webs at least regionally extend obliquely in relation to the main web.

9. The semiconductor chip according to claim 6, wherein the further contact webs have subregions, that extend at different angles in relation to the main web.

10. A method for producing a plurality of optoelectronic semiconductor chips, the method comprising:
providing a semiconductor layer sequence having a first semiconductor layer, an active region, and a second semiconductor layer;
forming a trench structure that extends through the second semiconductor layer and the active region into the first semiconductor layer;
forming a contact structure having a plurality of contact webs that are electrically conductively connected to the first semiconductor layer in the trench structure;
attaching the semiconductor layer sequence on a carrier;
singulating the carrier having the semiconductor layer sequence into the plurality of semiconductor chips;
regionally forming a terminal layer directly to the second semiconductor layer; and
forming a region of reduced conductivity in the second semiconductor layer.

11. The method according to claim 10, wherein the region of reduced conductivity provides electrical insulation of the terminal layer from the contact structure.

12. The method according to claim 10, wherein the contact structure and the terminal layer are used as masks during formation of the region of reduced conductivity.

13. The method according to claim 10, further comprising galvanically depositing a contact surface for external electrical contact on the contact structure.

14. The method according to claim 10, wherein the semiconductor layer sequence is structured before singulating and wherein edge regions of the semiconductor layer sequence adjoining lateral surfaces of the semiconductor layer sequence are at least regionally electrically deactivated.

15. The method according to claim 14, wherein the deactivation is performed by ion implantation, a plasma treatment, or a sputtering method.

16. An optoelectronic semiconductor chip comprising:
a carrier; and
a semiconductor body arranged on the carrier,
wherein the semiconductor body has a semiconductor layer sequence having an active region provided for generating or receiving radiation, a first semiconductor layer, and a second semiconductor layer,
wherein the active region is arranged between the first semiconductor layer and the second semiconductor layer,
wherein the first semiconductor layer is arranged on a side of the active region facing away from the carrier,
wherein a trench structure is formed in the semiconductor body, the trench structure extending through the second semiconductor layer and the active region into the first semiconductor layer,
wherein an electrical contact structure having a plurality of contact webs is disposed between the carrier and the semiconductor body,
wherein the contact webs are electrically conductively connected to the first semiconductor layer in the trench structure,
wherein the second semiconductor layer directly adjoins the contact structure, and
wherein the second semiconductor layer includes a region that has a reduced conductivity in comparison to remaining portions of the second semiconductor layer.

17. The semiconductor chip according to claim 16, wherein a terminal layer adjoins the second semiconductor layer and the contact structure, and wherein the contact structure and the terminal layer are arranged without overlap in relation to one another in a top view of the semiconductor chip.

* * * * *